(12) United States Patent  
Nakajikkoku

(10) Patent No.: US 7,545,128 B2
(45) Date of Patent: Jun. 9, 2009

(54) REGULATOR CIRCUIT

(75) Inventor: Masahiko Nakajikkoku, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 201 days.

(21) Appl. No.: 11/753,590

(22) Filed: May 25, 2007

(65) Prior Publication Data

US 2007/0290751 A1 Dec. 20, 2007

(30) Foreign Application Priority Data

May 30, 2006 (JP) ............................. 2006-149336

(51) Int. Cl.
*G05F 1/40* (2006.01)
(52) U.S. Cl. ...................................... 323/281; 323/282
(58) Field of Classification Search ................. 323/273, 323/280, 281, 282, 286, 351
See application file for complete search history.

(56) References Cited

U.S. PATENT DOCUMENTS 7,368,896 B2 * 5/2008 Nagata et al. ................ 323/280

FOREIGN PATENT DOCUMENTS

JP 2002-268758 9/2002

* cited by examiner

*Primary Examiner*—Adolf Berhane
(74) *Attorney, Agent, or Firm*—Volentine & Whitt, P.L.L.C.

(57) ABSTRACT

With the objective of reducing current consumption of a regulator circuit per se, switches for performing on/off of an operating current are inserted in series with transistors of a reference voltage generating unit and a differential amplifying unit that constitute the regulator circuit. A switch for turning on/off an electrical connection between the reference voltage generating unit and the differential amplifying unit is provided. These switches are periodically on/off-controlled in accordance with a clock signal. Incidentally, when the timing provided to turn on the switch is made faster than the timings provided to turn on the remaining switches, the operation of the differential amplifying unit can be further stabilized.

2 Claims, 4 Drawing Sheets

REGULATOR CIRCUIT

BACKGROUND OF THE INVENTION

The present invention relates to a regulator circuit which supplies a predetermined source voltage to a logic circuit or the like, and particularly to a reduction in power consumption.

FIG. 2 is a configuration diagram of a conventional regulator circuit.

The regulator circuit generates a constant voltage VREG from a source potential VDD and supplies the same to a logic block 40. The regulator circuit has a reference voltage generating unit 10, a differential amplifying unit 20 and a bias voltage generating unit 30.

The reference voltage generating unit 10 comprises a P channel MOS transistor (hereinafter called "PMOS") 11 connected between the source potential VDD and a node N1, and a PMOS 12 and an N channel MOS transistor (hereinafter called "NMOS") 13 diode-connected in the forward direction and series-connected between the node N1 and a ground potential GND. The gate of the PMOS 11 is supplied with a bias voltage VBa from the bias voltage generating unit 30 and a reference voltage VREF is outputted from the node N1.

The differential amplifying unit 20 has NMOSs 21a and 21b whose gates are supplied with the reference voltage VREF and an adjusted or regulated voltage VREG respectively. The drains of the NMOSs 21a and 21b are respectively connected to the source potential VDD through PMOSs 22a and 22b. The sources thereof are commonly connected to a node N2. The node N2 is connected to the ground potential GND through an NMOS 23. The gates of the PMOSs 22a and 22b are connected to the drain of the NMOS 21b, and the drain of the NMOS 21a is connected to the gate of a PMOS 24.

The source and drain of the PMOS 24 are respectively connected to the source potential VDD and a node N3. The drain of an NMOS 25 is connected to the node N3, and the source thereof is connected to the ground potential GND. The gates of the NMOSs 23 and 25 are supplied with a bias voltage VBb from the bias voltage generating unit 30 so that a regulated voltage VREG is outputted from the node N3, followed by being supplied to the logic block 40.

Incidentally, the regulator circuit is used with an external stabilization capacitor 41 corresponding to the maximum load current of the logic block 40 being connected between the node N3 and the ground potential GND in addition to the logic block 40.

In the regulator circuit, a predetermined constant current flows through the PMOS 11 of the reference voltage generating unit 10 and the NMOSs 23 and 25 of the differential amplifying unit 20 according to the bias voltages VBa and VBb supplied from the bias voltage generating unit 30. Thus, a reference voltage VREF occurs in the node N1 of the reference voltage generating unit 10. The reference voltage VREF is supplied to the voltage-follower connected differential amplifying unit 20, and a voltage VREG regulated so as to assume the same potential as the reference voltage VREF is outputted from the node N3 corresponding to an output terminal of the differential amplifying unit 20. The voltage VREG is applied across the smoothing stabilization capacitor 41 and supplied to the logic block 40 as a source voltage.

The above related art refers to a patent document 1 (Japanese Unexamined Patent Publication No. 2002-268758).

In the regulator circuit, however, the constant current always flows through the PMOS 11 of the reference voltage generating unit 10 and the NMOSs 23 and 25 of the differential amplifying unit 20 according to the bias voltages VBa and VBb regardless of the load current that flows through the logic block 40. Therefore, it has interfered with a reduction in power consumption in a microminiaturized portable device such as a clock.

SUMMARY OF THE INVENTION

With the foregoing in view, it is therefore an object of the present invention to reduce current consumption of a regulator circuit per se.

According to one aspect of the present invention, for attaining the above object, there is provided a regulator circuit comprising a reference voltage generating unit which allows a constant current to flow from a source potential to a ground potential thereby to generate a reference voltage at an internal node, a differential amplifying unit which differential-amplifies the reference voltage of the internal node and an output voltage of an output node thereby to output the same voltage as the reference voltage to the output node, first switch means which on/off-controls a flow of the constant current of the reference voltage generating unit in accordance with a clock signal, second switch means which on/off-controls an amplifying operation of the differential amplifying unit with the same timing as the reference voltage generating unit, and third switch means which on/off-controls a connection between the internal node and the differential amplifying unit with the same timing as the second switch means.

The present invention includes switch means which periodically on/off-controls operations of a reference voltage generating unit and a differential amplifying unit in accordance with a clock signal. Thus, the present invention brings about the effect that current consumption of a regulator circuit itself can be reduced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Constituting switch means so as to control the operation of a reference voltage generating unit in accordance with a clock signal and to start an amplifying operation of a differential amplifying unit with being delayed from the reference voltage generating unit and stop the operation simultaneously with the reference voltage generating unit makes it possible to stabilize the amplifying operation of the differential amplifying unit and further stabilize the voltage of an output node.

The above and other objects and novel features of the present invention will become more completely apparent from the following descriptions of preferred embodiments when the same is read with reference to the accompanying drawings. The drawings, however, are for the purpose of illustration only and by no means limitative of the invention.

First Preferred Embodiment

Figure 1:
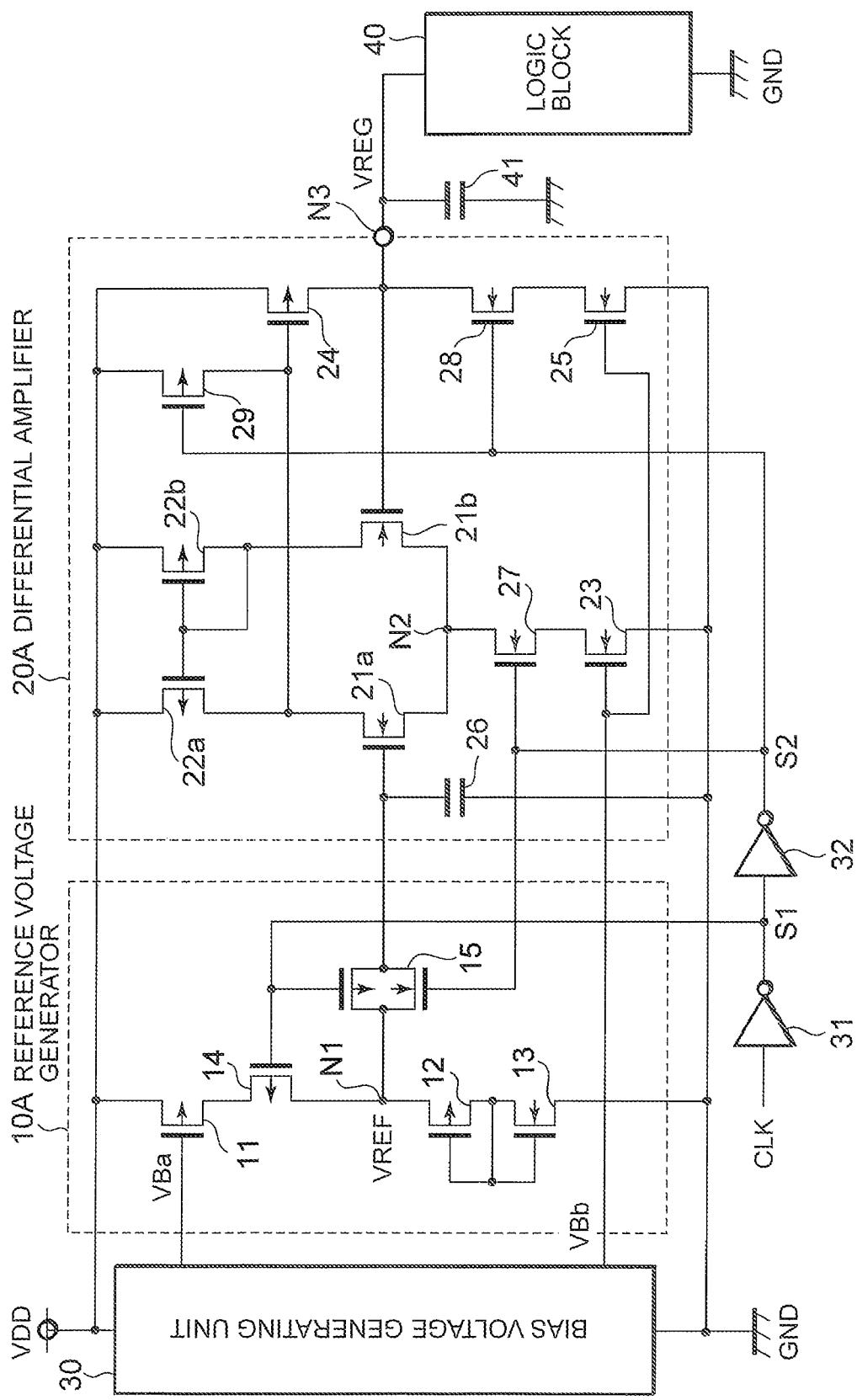
FIG. 1 is a configuration diagram of a regulator circuit showing a first embodiment of the present invention.

FIG. 1 is a configuration diagram of a regulator circuit showing a first embodiment of the present invention. Constituent elements common to those shown in FIG. 2 are given common reference numerals respectively.

The regulator circuit is used in, for example, a clock LSI (Large Scale Integration) or the like. The regulator circuit generates a predetermined voltage VREG from a source potential VDD and supplies the same to a logic block 40. The regulator circuit has a reference voltage generating unit 10A, a differential amplifying unit 20A, a bias voltage generating unit 30 and inverters 31 and 32.

Figure 2:
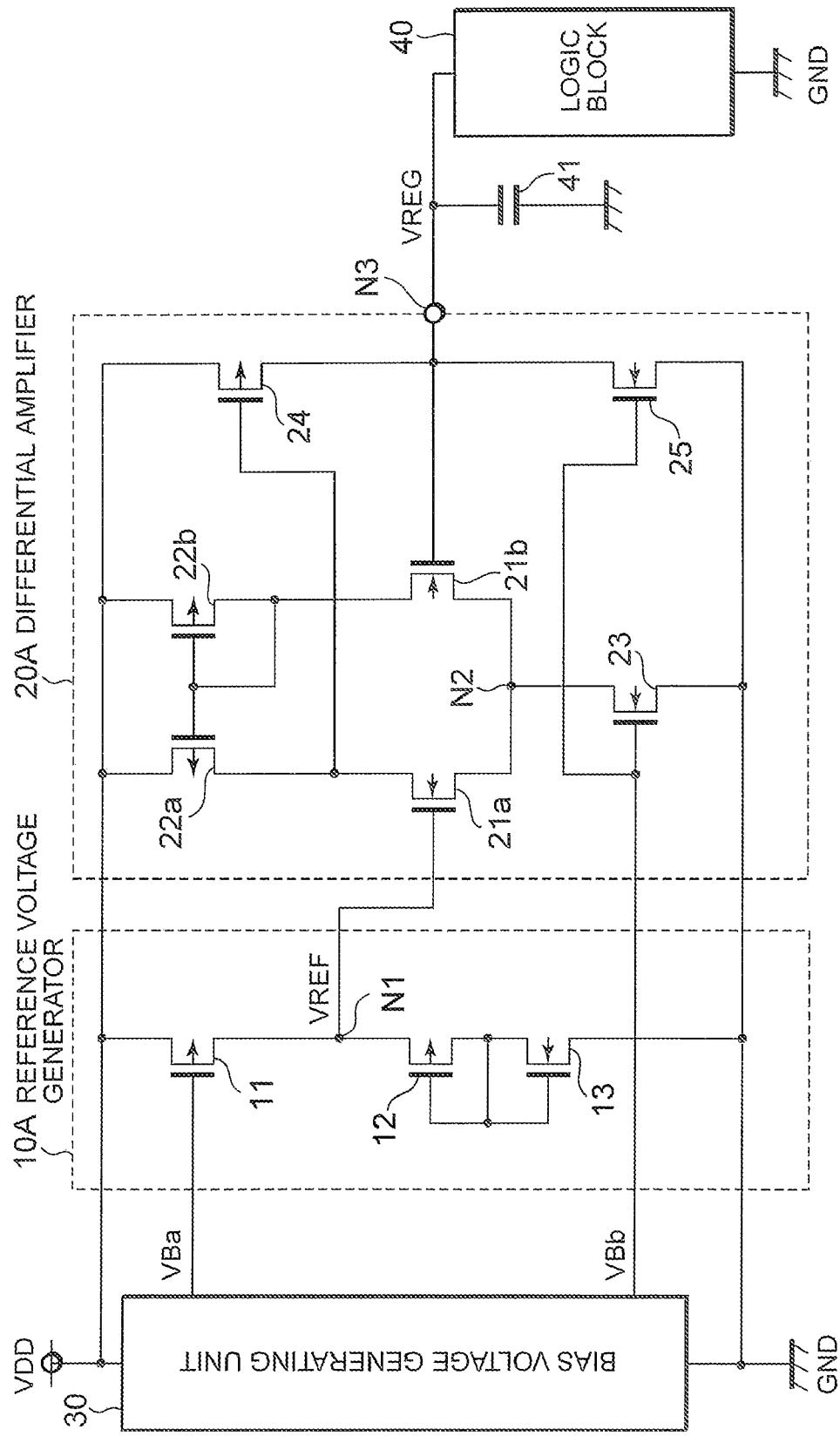
FIG. 2 is a configuration diagram of a conventional regulator circuit.

In the reference voltage generating unit 10A, a switch 14 (first switch means) constituted of a PMOS is inserted between the drain side of the PMOS 11 of the reference voltage generator 10 shown in FIG. 2 and the node N1. Further, a transfer gate type switch 15 (third switch means) constituted of a PMOS 15p and an NMOS 15n is provided between the node N1 and the differential amplifying unit 20A.

That is, the reference voltage generating unit 10A comprises the PMOS 11 and switch 14 connected in series between the source potential VDD and the node N1, a PMOS 12 and an NMOS 13 diode-connected in the forward direction and series-connected between the node N1 and a ground potential GND, and the switch 15 of which one end is connected to the node N1 and the other end is connected to the gate of an NMOS 21a of the differential amplifying unit 20A.

The gate of the PMOS 11 is supplied with a bias voltage VBa from the bias voltage generating unit 30. The gates of the PMOSs that constitute the switches 14 and 15 are supplied with a signal S1 generated by inverting a clock signal CLK by the inverter 31. The gate of the NMOS that constitutes the switch 15 is supplied with a signal S2 generated by further inverting the signal S1 by the inverter 32. A reference clock signal (e.g., 32.768 kHz) for a clock generated within the logic block 40 is used as for the clock signal CLK. When the switches 14 and 15 are turned on, a reference voltage VREF is outputted from the switch 15. Incidentally, the switch 14 is inserted into the drain side of the PMOS 11 in such a manner that the PMOS 11 is supplied with the normal bias voltage VBa.

The differential amplifying unit 20A is equivalent to one provided with switches 27 through 29 (second switch means) for on/off-controlling the amplifying operation of the differential amplifying unit 20 shown in FIG. 2 in accordance with the clock signal CLK.

That is, the differential amplifying unit 20A has NMOSs 21a and 21b of which the gates are respectively supplied with the reference voltage VREF and the adjusted or regulated voltage VREG through the switch 15. The drains of the NMOSs 21a and 21b are connected to the source potential VDD through the PMOSs 22a and 22b, whereas the sources thereof are commonly connected to a node N2. The node N2 is connected to the ground potential GND through a switch 27 constituted to an NMOS and an NMOS 23. The gates of the PMOSs 22a and 22b are connected to the drain of the NMOS 21b, and the drain of the NMOS 21a is connected to the gate of the PMOS 24.

The source and drain of the PMOS 24 are respectively connected to the source potential VDD and a node N3, whereas the gate thereof is connected to the source potential VDD through a switch 29 constituted of a PMOS. The drain of an NMOS 25 is connected to the node N3 through a switch 28 constituted of an NMOS, whereas the source thereof is connected to the ground potential GND.

The gates of the NMOSs that constitute the switches 27 and 28, and the gate of the PMOS that constitutes the switch 29 are supplied with the signal S2. A bias voltage VBb is supplied from the bias voltage generating unit 30 to the gates of the NMOSs 23 and 25, and the regulated voltage VREG is outputted from the node N3 and supplied to the logic block 40. Incidentally, the switches 27 and 28 are inserted into the drain sides of the NMOSs 23 and 25 in such a manner that the normal bias voltage VBb is supplied to the NMOSs 23 and 25.

The regulator circuit is used with an external stabilization capacitor 41 corresponding to the maximum load current of the logic block 40 being connected between the node N3 and the ground potential GND in addition to the logic block 40.

The operation of the regulator circuit will next be explained.

When the clock signal CLK is "H", the signals S1 and S2 go "L" and "H" respectively, so that the switches 14, 15, 27 and 28 are turned on and the switch 29 is turned off. Thus, in the regulator circuit, a predetermined constant current flows through the PMOS 11 of the reference voltage generating unit 10A and the NMOSs 23 and 25 of the differential amplifying unit 20A according to bias voltages VBa and VBb supplied from the bias voltage generating unit 30. Thus, a reference voltage VREF occurs in the node N1 of the reference voltage generating unit 10A. The reference voltage VREF is supplied to the voltage-follower connected differential amplifying unit 20A, and a voltage VREG regulated so as to assume the same potential as the reference voltage VREF is outputted from the node N3 corresponding to an output terminal of the differential amplifying unit 20A. The voltage VREG is applied across the smoothing stabilization capacitor 41 to charge the stabilization capacitor 41 to the voltage VREG. Further, the voltage VREG is supplied to the logic block 40 as a source voltage.

On the other hand, when the clock signal CLK is "L", the signals S1 and S2 are respectively brought to "H" and "L", so that the switches 14, 15, 27 and 28 are turned off and the switch 29 is turned on. Thus, all of the currents flowing through the transistors of the reference voltage generating unit 10A and the differential amplifying unit 20A are brought into zero so that the operations thereof are stopped, thereby bringing the node N3 into a high impedance state. Accordingly, the current for the logic block 40 is supplied from the external stabilization capacitor 41.

Thus, the reference voltage generating unit 10A and the differential amplifying unit 20A alternately repeat their operations and stops in accordance with the clock signal CLK. Since no current flows through these circuits during the period in which the reference voltage generating unit 10A and the differential amplifying unit 20A are being deactivated, there is an advantage that the average current consumption of the regulator circuit per se can be reduced.

Assuming that an operating current that flows through each of the reference voltage generating unit 10A and the differential amplifying unit 20A is 100 nA, for example, the average current consumption reaches 50 nA if the duty of the clock signal CLK is defined as 50%. If the duty is defined as 20%, then the average current consumption becomes 20 nA. Since, however, the current for the logic block 40 is supplied from the external stabilization capacitor 41 during the period in which the reference voltage generating unit 10A and the differential amplifying unit 20A are being deactivated, the value of the stabilization capacitor 41 needs to be set to a sufficiently larger value (e.g. 0.1 to 0.33 μF) in consideration of the current consumption of the logic block 40.

Second Preferred Embodiment

Figure 3:
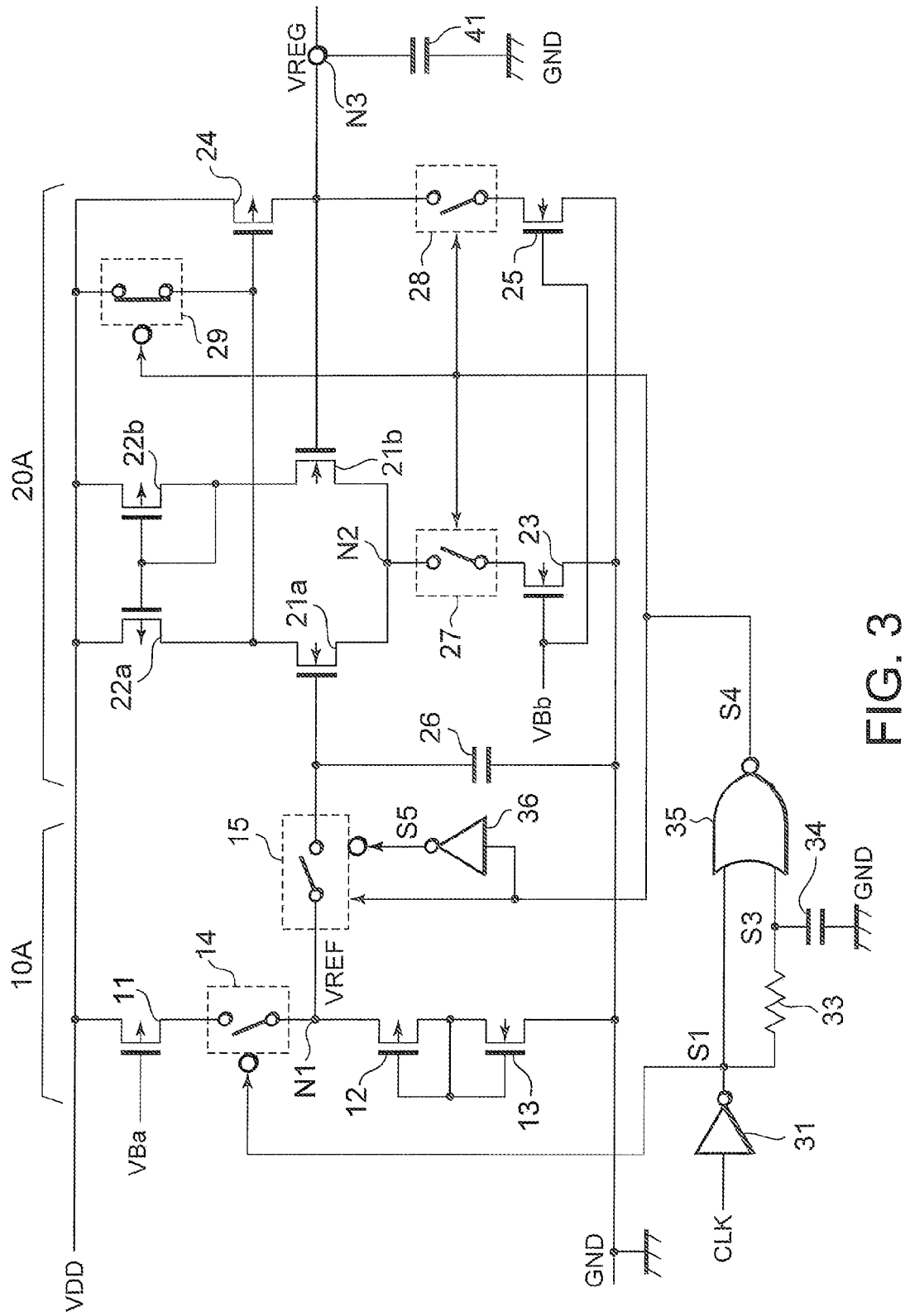
FIG. 3 is a configuration diagram of a regulator circuit showing a second embodiment of the present invention.

FIG. 3 is a configuration diagram of a regulator circuit showing a second embodiment of the present invention. Constituent elements common to those shown in FIG. 1 are given common reference numerals respectively.

In the present regulator circuit, timings provided for control signals supplied to switches 14, 15 and 27 through 29 are slightly changed as compared with FIG. 1. That is, the present regulator circuit includes, in addition to an inverter 31 for generating a signal S1 obtained by inverting a clock signal CLK, an integration circuit constituted of a resistor 33 and a capacitor 34 for generating a signal S3 obtained by delaying the signal S1, for example, 100 μs or so, a NOR gate 35 which outputs the negative ORing of the signals S1 and 53 as a signal S4, and an inverter 36 which inverts the signal S4 and outputs a signal S5. Then, the signal S1 is supplied to the switch 14, the complementary signals S4 and S5 are supplied to the switch 15, and the signal S4 is supplied to the switches 27 through 29.

Figure 4:
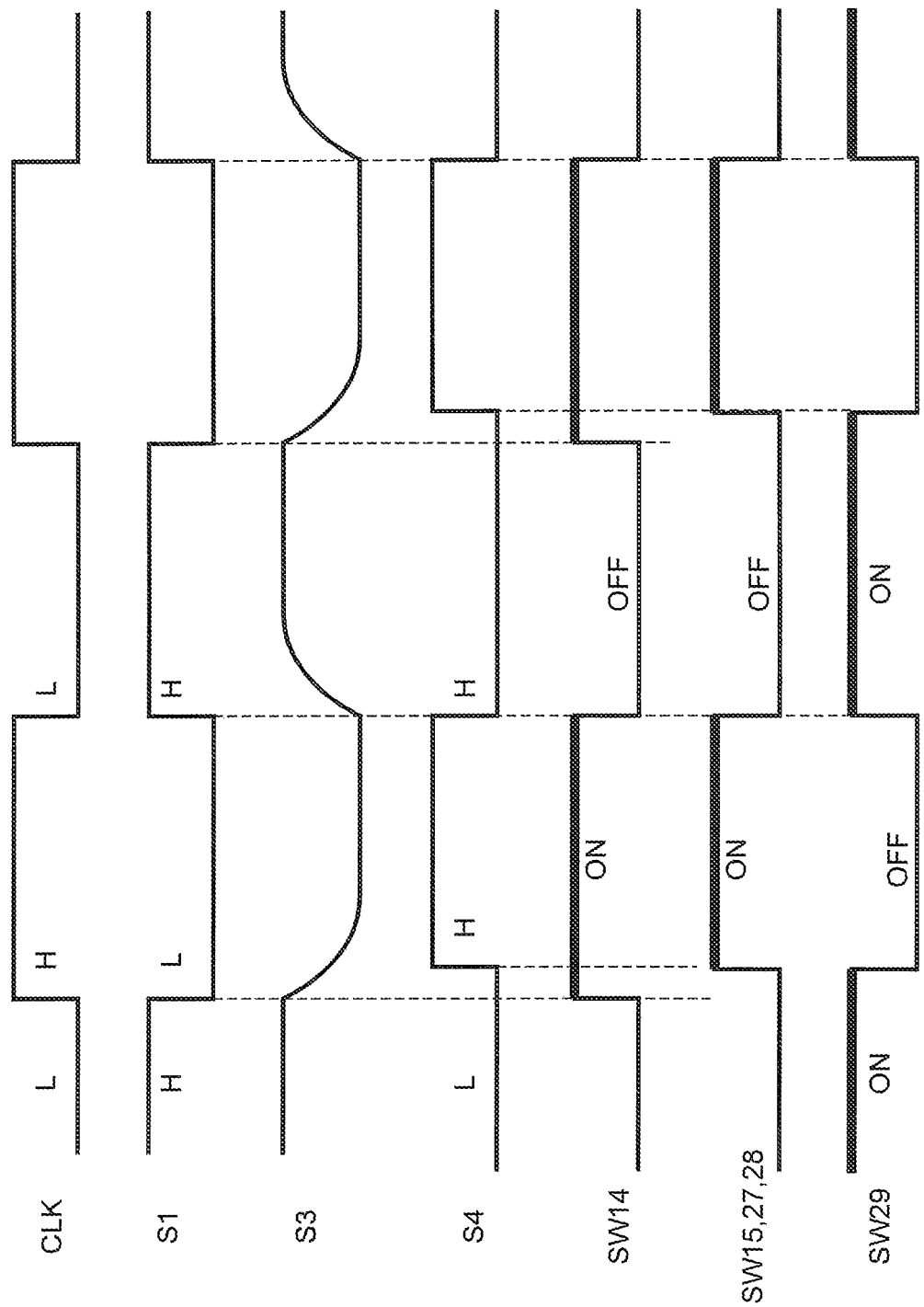
FIG. 4 is a signal waveform diagram showing operations of FIG. 3.

FIG. 4 is a signal waveform diagram showing operations of FIG. 3. The operations shown in FIG. 3 will be explained below with reference to FIG. 4.

When the clock signal CLK is "L", the signal S1 is "H" and the signal S3 is brought to "H" in a stable state. The signals S4 and S5 go "L" and "H" respectively. Thus, the switches 14, 15, 27 and 28 are off and the switch 29 is on. Hence, currents flowing through transistors of a reference voltage generating unit 10A and a differential amplifying unit 20A are all brought to zero so that their operations are stopped, thereby bringing a node N3 to a high impedance state. Accordingly, the current for a logic block 40 is supplied from an external stabilization capacitor 41.

Next, when the clock signal CLK rises from "L" to "H", the signal S1 immediately changes to "L" so that the switch 14 is turned on. On the other hand, the signal S3 is held in a state of "H" for a while because an integration circuit is provided. Accordingly, the signal S4 is also held in a state of "L" for a while. Thus, only the reference voltage generating unit 10A starts operating and the differential amplifying unit 20A remains deactivated. A reference voltage VREF is outputted to a node N1 by the operation of the reference voltage generating unit 10A.

When the clock signal CLK rises and a time of 100 μs or so has elapsed, the signal S3 corresponding to the output of the integration circuit is brought to "L". Thus, the signals S4 and S5 are brought to "H" and "L" respectively, so the switches 14, 15, 27 and 28 are turned on and the switch 29 is turned off. Thus, the differential amplifying unit 20A starts operating and hence the reference voltage VREF of the node N1 generated at the reference voltage generating unit 10A is supplied to the differential amplifying unit 20A. A voltage VREG adjusted so as to assume the same potential as the reference voltage VREF is outputted from a node N3 corresponding to an output terminal of the differential amplifying unit 20A. The voltage VREG is applied to the smoothing stabilization capacitor 41 to charge the stabilization capacitor 41 to the voltage VREG. Further, the voltage VREG is supplied to the logic block 40 as a source voltage.

Thereafter, when the clock signal CLK falls to "L", the signal S1 is brought to "H", the signal S4 reaches "L" and the signal S5 goes "H". Thus, the reference voltage generating unit 10A and the differential amplifying unit 20A are deactivated so that the node N3 is brought into a high impedance state, whereby the current for the logic block 40 is supplied from the external stabilization capacitor 41. This operation is repeated in accordance with the clock signal CLK.

As described above, the regulator circuit according to the second embodiment has a timing circuit (including an integration circuit constituted of a resistor 33 and a capacitor 34, and a NOR gate 35 which outputs the negative ORing of the signals S1 and S3 as the signal S4) for firstly allowing the reference voltage generating unit 10A to start its operation when it starts operating from a halt condition, thereby generating the reference voltage VREF at the node N1 and thereafter allowing the differential amplifying unit 20A to start its operation. Thus, the regulator circuit has the advantage of being capable of lessening a reduction in the level of the voltage VREG and outputting a stabler voltage VREG in addition to an advantage similar to the first embodiment since the reference voltage VREF can immediately be supplied to the differential amplifying unit 20A when the operation of the differential amplifying unit 20A is started.

Incidentally, the present invention is not limited to the above embodiments. Various modifications can be made thereto. For example, the configuration of each of the reference voltage generating unit 10A, the differential amplifying unit 20A and the timing circuit for controlling the switches can be substituted with another circuit configuration having similar functions.

What is claimed is:

1. A regulator circuit comprising:
   a reference voltage generating unit which allows a constant current to flow from a source potential to a ground potential thereby to generate a reference voltage at an internal node;
   a differential amplifying unit which differential-amplifies the reference voltage of the internal node and an output voltage of an output node thereby to output the same voltage as the reference voltage to the output node;
   first switch means which on/off-controls a flow of the constant current of the reference voltage generating unit in accordance with a clock signal;
   second switch means which on/off-controls an amplifying operation of the differential amplifying unit with the same timing as the reference voltage generating unit; and
   third switch means which on/off-controls a connection between the internal node and the differential amplifying unit with the same timing as the second switch means.

2. A regulator circuit comprising:
   a reference voltage generating unit which allows a constant current to flow from a source potential to a ground potential thereby to generate a reference voltage at an internal node;
   a differential amplifying unit which differential-amplifies the reference voltage of the internal node and an output voltage of an output node thereby to output the same voltage as the reference voltage to the output node;
   first switch means which on/off-controls a flow of the constant current of the reference voltage generating unit in accordance with a clock signal;
   second switch means which starts an amplifying operation of the differential amplifying unit with being delayed from the reference voltage generating unit and stops the operation simultaneously with the reference voltage generating unit; and
   third switch means which on/off-controls a connection between the internal node and the differential amplifying unit with the same timing as the second switch means.

* * * * *